(12) United States Patent
Jiang

(10) Patent No.: US 12,363,842 B2
(45) Date of Patent: *Jul. 15, 2025

(54) FLEXIBLE DISPLAY DEVICE

(71) Applicants: WUHAN CHINA STAR OPTOELECTRONICS TECHNOLOGY CO., LTD., Hubei (CN); WUHAN CHINA STAR OPTOELECTRONICS SEMICONDUCTOR DISPLAY TECHNOLOGY CO., LTD., Hubei (CN)

(72) Inventor: Guobao Jiang, Hubei (CN)

(73) Assignees: WUHAN CHINA STAR OPTOELECTRONICS TECHNOLOGY CO., LTD., Wuhan (CN); WUHAN CHINA STAR OPTOELECTRONICS SEMICONDUCTOR DISPLAY TECHNOLOGY CO., LTD., Wuhan (CN)

(*) Notice: Subject to any disclaimer, the term of this patent is extended or adjusted under 35 U.S.C. 154(b) by 0 days.

This patent is subject to a terminal disclaimer.

(21) Appl. No.: 18/657,282

(22) Filed: May 7, 2024

(65) Prior Publication Data

US 2024/0292555 A1    Aug. 29, 2024

Related U.S. Application Data

(63) Continuation of application No. 17/600,135, filed as application No. PCT/CN2021/106943 on Jul. 16, 2021, now Pat. No. 12,016,142.

(30) Foreign Application Priority Data

Jun. 21, 2021   (CN) .......................... 202110684895.5

(51) Int. Cl.
*H05K 5/02*    (2006.01)

(52) U.S. Cl.
CPC .................................. *H05K 5/0217* (2013.01)

(58) Field of Classification Search
CPC .......................... H05K 5/0017; H05K 5/0217
(Continued)

(56) References Cited

U.S. PATENT DOCUMENTS 11,849,549 B2 *  12/2023  Feng ...................... G09F 9/301
12,016,142 B2 *   6/2024  Jiang ..................... G06F 1/1652
(Continued)

FOREIGN PATENT DOCUMENTS

CN    107820399 A    3/2018
CN    208922657 U    5/2019
(Continued)

OTHER PUBLICATIONS

Chinese Office Action issued in corresponding Chinese Patent Application No. 202110684895.5 dated Mar. 1, 2022, pp. 1-8.
(Continued)

*Primary Examiner* — Hung S. Bui
(74) *Attorney, Agent, or Firm* — PV IP PC; Wei Te Chung

(57) ABSTRACT

The present disclosure discloses a flexible display device. The flexible display device includes a housing, a telescopic assembly, a flexible screen, and a transmission assembly. Both ends of the flexible screen are connected to the telescopic assembly. The transmission assembly is configured to drive, during the movement relative to the housing, the telescopic assembly to stretch or contract. In this way, the flexible screen is pulled out or rolled for storage.

20 Claims, 5 Drawing Sheets

(58) Field of Classification Search
USPC .................. 361/807, 809, 810, 755, 737
See application file for complete search history.

(56) References Cited

U.S. PATENT DOCUMENTS

| | | |
|---|---|---|
| 2012/0314400 A1 | 12/2012 | Bohn et al. |
| 2019/0302846 A1 | 10/2019 | Cui |

FOREIGN PATENT DOCUMENTS

| | | |
|---|---|---|
| CN | 110189635 A | 8/2019 |
| CN | 110273915 A | 9/2019 |
| CN | 110288914 A | 9/2019 |
| CN | 110491289 A | 11/2019 |
| CN | 110738932 A | 1/2020 |
| CN | 110881068 A | 3/2020 |
| CN | 111508372 A | 8/2020 |
| CN | 111508374 A | 8/2020 |
| CN | 111510536 A | 8/2020 |
| CN | 111510537 A | 8/2020 |
| CN | 111510538 A | 8/2020 |
| CN | 111833743 A | 10/2020 |
| CN | 111833748 A | 10/2020 |
| CN | 111899644 A | 11/2020 |
| CN | 111935345 A | 11/2020 |
| CN | 212229972 U | 12/2020 |
| CN | 112216207 A | 1/2021 |
| CN | 112286288 A | 1/2021 |
| CN | 212537267 U | 2/2021 |
| CN | 112530286 A | 3/2021 |
| CN | 212649898 U | 3/2021 |
| CN | 112769982 A | 5/2021 |

OTHER PUBLICATIONS

Chinese Office Action issued in corresponding Chinese Patent Application No. 202110684895.5 dated Sep. 5, 2022, pp. 1-9.
Chinese Office Action issued in corresponding Chinese Patent Application No. 202110684895.5 dated Jan. 19, 2023, pp. 1-6.
Chinese Rejection Decision issued in corresponding Chinese Patent Application No. 202110684895.5 dated Apr. 19, 2023, pp. 1-7.
International Search Report in International application No. PCT/CN2021/106943, mailed on Mar. 15, 2022.
Written Opinion of the International Search Authority in International application No. PCT/CN2021/106943, mailed on Mar. 15, 2022.

\* cited by examiner

FLEXIBLE DISPLAY DEVICE

CROSS-REFERENCE TO RELATED APPLICATIONS

This application is a continuation application of U.S. application Ser. No. 17/600,135, filed on Sep. 30, 2021, which is a US national phase application based upon an International Application No. PCT/CN2021/106943, filed on Jul. 16, 2021, which claims priority to Chinese Patent Application No. 202110684895.5, filed on Jun. 21, 2021. The entire disclosures of the above applications are incorporated herein by reference.

FIELD AND BACKGROUND OF THE INVENTION

The present disclosure relates to display technologies, and more particularly, to a flexible display device.

With the development of display technology, users have also put forward various requirements for display devices. In order to meet different use requirements, various display products having different characteristics have also emerged accordingly. Nowadays, consumers not only pursue a simple large screen, but also desire a display product that can satisfy requirements of portability while having a large screen.

Organic light-emitting diode (OLED) display devices have received widespread attention due to their flexibility and flexibility. By folding or rolling up the OLED display device, the space occupied by the larger screen can be reduced, so that the device is more portable. Therefore, foldable and rollable display devices are one of the main research directions of the OLED display devices.

At present, in the rollable display device, the flexible screen can be pulled out for large-size display or accommodated for small-size display. However, the flexible screen is prone to skew or jam during the process of being stretched or received.

SUMMARY OF THE INVENTION

Embodiments of the present disclosure provide a flexible display device, which can roll and store the flexible screen to reduce the occupied space and increase the portability. In addition, the received flexible screen can be flexibly and conveniently taken out for large-size display.

An embodiment of the present disclosure provides a flexible display device, including:
  a housing;
  a telescopic assembly, including a first support portion disposed on the housing, a second support portion movably connected to the first support portion, and a rotary receiving portion disposed in the second support portion;
  a flexible screen, disposed on the telescopic assembly, and having one end connected to the first support portion and an other end connected to the rotary receiving portion; and
  a transmission assembly, disposed on the second support portion, and having one end movably connected to the housing and an other end drivingly connected to the rotary receiving portion, wherein the transmission assembly is configured to: during the movement relative to the housing, drive the second support portion to move relative to the first support portion, and drive the rotary receiving portion to rotate, so as to switch the flexible display device between a first state and a second state, wherein an area of the flexible screen in the first state on the first support portion and the second support portion is less than an area of the flexible screen in the second state on the first support portion and the second support portion.

In an embodiment of the present disclosure, the transmission assembly includes at least one first transmission member disposed on the second support portion and movably connected to the housing and at least one second transmission member disposed on the second support portion and movably connected to the housing, one end of each first transmission member is drivingly connected to one corresponding second transmission member, and an other end of the each first transmission member is drivingly connected to the rotary receiving portion.

In an embodiment of the present disclosure, the first transmission member includes a screw rod structure disposed on the second support portion and a first transmission gear and a second transmission gear respectively disposed at two ends of the screw rod, and the first transmission gear is drivingly connected to the rotary receiving portion; and
  a rack is disposed on the housing, and the second transmission member includes a first rotary shaft, a third transmission gear disposed on one end of the first rotary shaft and meshed with the rack, and a fourth transmission gear disposed at an other end of the first rotary shaft and meshed with the second transmission gear.

In an embodiment of the present disclosure, the flexible display device further includes a motor disposed in the housing, wherein an output end of the motor is connected to the fourth transmission gear.

In an embodiment of the present disclosure, the rotary receiving portion includes a second rotary shaft and a fifth transmission gear disposed on the second rotary shaft, and the fifth transmission gear is meshed with the first transmission gear.

In an embodiment of the present disclosure, the transmission assembly includes two first transmission members disposed on two opposite sides of the second support portion and two second transmission members disposed on the two opposite sides of the second support portion, one end of each first transmission member is drivingly connected to one corresponding second transmission member, and an other end of the each first transmission member is drivingly connected to the rotary receiving portion.

In an embodiment of the present disclosure, the flexible display device further includes an elastic member connected between the housing and the first support portion, wherein the first support portion is movably connected to the housing.

In an embodiment of the present disclosure, the elastic member is in a stretched state in both the first state and the second state.

In an embodiment of the present disclosure, the first support portion includes a plurality of first support plates, the second support portion includes a plurality of second support plates, and the flexible screen is laid on the plurality of first support plates and the plurality of second support plates, wherein the plurality of first support plates are movably connected to the plurality of second support plates.

In an embodiment of the present disclosure, the plurality of first support plates and the plurality of second support plates are alternately disposed, and a distance between any two adjacent first support plates is equal to a width of any one second support plate.

According to the above objective of the present disclosure, a flexible display device is provided, including:

a housing;

a telescopic assembly, including a first support portion disposed on the housing, a second support portion movably connected to the first support portion, and a rotary receiving portion disposed in the second support portion;

a flexible screen, disposed on the telescopic assembly, and having one end connected to the first support portion and an other end connected to the rotary receiving portion; and a transmission assembly, disposed on the second support portion, and having one end movably connected to the housing and an other end drivingly connected to the rotary receiving portion, wherein the transmission assembly is configured to, during the movement relative to the housing, drive the second support portion to move relative to the first support portion, and drive the rotary receiving portion to rotate, so as to switch the flexible display device between a first state and a second state, wherein an area of the flexible screen in the first state on the first support portion and the second support portion is less than an area of the flexible screen in the second state on the first support portion and the second support portion, wherein the transmission assembly includes at least one first transmission member disposed on the second support portion and movably connected to the housing and at least one second transmission member disposed on the second support portion and movably connected to the housing, one end of each first transmission member is drivingly connected to one corresponding second transmission member, and an other end of the each first transmission member is drivingly connected to the rotary receiving portion.

In an embodiment of the present disclosure, the first transmission member includes a screw rod structure disposed on the second support portion and a first transmission gear and a second transmission gear respectively disposed at two ends of the screw rod structure, and the first transmission gear is drivingly connected to the rotary receiving portion; and a rack is disposed on the housing, and the second transmission member includes a first rotary shaft, a third transmission gear disposed on one end of the first rotary shaft and meshed with the rack, and a fourth transmission gear disposed at an other end of the first rotary shaft and meshed with the second transmission gear.

In an embodiment of the present disclosure, the flexible display device further includes a motor disposed in the housing, wherein an output end of the motor is connected to the fourth transmission gear.

In an embodiment of the present disclosure, the rotary receiving portion includes a second rotary shaft and a fifth transmission gear disposed on the second rotary shaft, and the fifth transmission gear is meshed with the first transmission gear.

In an embodiment of the present disclosure, the transmission assembly includes two first transmission members disposed on two opposite sides of the second support portion and two second transmission members disposed on the two opposite sides of the second support portion, one end of each first transmission member is drivingly connected to one corresponding second transmission member, and an other end of the each first transmission member is drivingly connected to the rotary receiving portion.

In an embodiment of the present disclosure, the flexible display device further includes an elastic member connected between the housing and the first support portion, wherein the first support portion is movably connected to the housing.

In an embodiment of the present disclosure, the elastic member is in a stretched state in both the first state and the second state.

In an embodiment of the present disclosure, the first support portion includes a plurality of first support plates, the second support portion includes a plurality of second support plates, and the flexible screen is laid on the plurality of first support plates and the plurality of second support plates, wherein the plurality of first support plates are movably connected to the plurality of second support plates.

In an embodiment of the present disclosure, the plurality of first support plates and the plurality of second support plates are alternately disposed, and a distance between any two adjacent first support plates is equal to a width of any one second support plate.

According to the present disclosure, one end of a flexible screen is connected to a first support portion, and an other end of the flexible screen is connected to a rotary receiving portion. The rotary receiving portion is located in a second support portion, and the second support portion is movably connected to the first support portion. In addition, according to the embodiment of the present disclosure, a transmission assembly is further correspondingly disposed. The transmission assembly drives the second support portion to move relative to the first support portion and drives the rotary receiving portion to rotate during the movement relative to the housing, so that the area of the flexible screen on the first support portion and the second support portion can be increased or decreased. According to the embodiment of the present disclosure, by disposing the transmission assembly to achieve the synchronization of the relative movement of the first support portion and the second support portion and the rotation of the rotary receiving portion, the force uniformity and synchronization of the flexible display device during the state switching process are improved. In this way, the flexible screen can be prevented from being damaged due to uneven transmission force. Therefore, by means of the embodiments of the present disclosure, the reliability of the flexible display device is improved, and the rapid and flexible switching of the flexible display device between the small-size portable state and the large-size display state is implemented.

BRIEF DESCRIPTION OF THE SEVERAL VIEWS OF THE DRAWINGS

The following describes specific implementations of the present disclosure in detail with reference to the accompanying drawings, to make the technical solutions and other beneficial effects of the present disclosure obvious.

DESCRIPTION OF SPECIFIC EMBODIMENTS OF THE INVENTION

The following clearly and completely describes the technical solutions in the embodiments of the present disclosure with reference to the accompanying drawings in the embodiments of the present disclosure. Apparently, the described embodiments are merely some embodiments rather than all the embodiments of the present disclosure. All other embodiments obtained by a person skilled in the art based on the embodiments of the present disclosure without creative efforts shall fall within the protection scope of the present disclosure.

Many different implementations or examples are provided below to implement different structures of the present disclosure. To simplify the disclosure of the present disclosure, the following describes components and settings of particular examples. Certainly, the components and settings are merely examples, and are not intended to limit the present disclosure. In addition, in the present disclosure, reference numbers and/or reference letters may be repeated in different examples. Such repetition is intended to simplify and clarify the present disclosure, and does not indicate a relationship between various implementations and/or settings that are discussed. Moreover, the present disclosure provides examples of various particular processes and materials, but a person of ordinary skill in the art may be aware of application of another process and/or use of another material.

Figure 1:
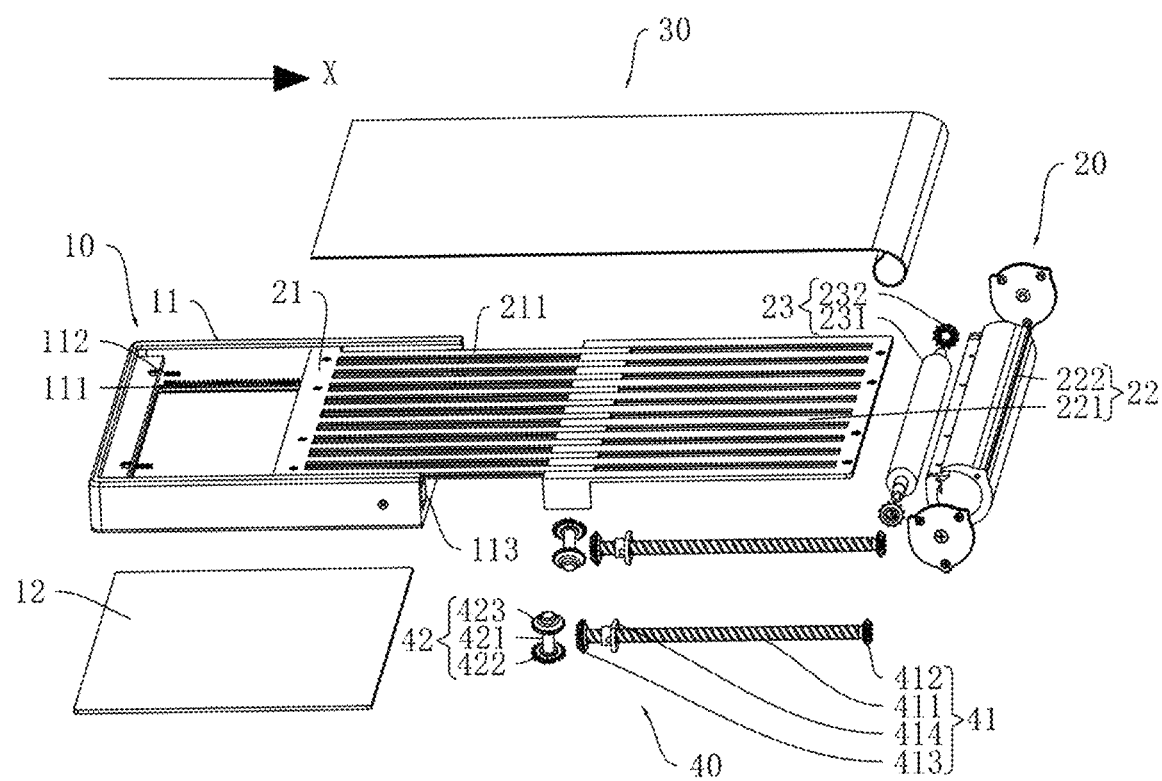
FIG. 1 is a schematic diagram of a breakdown structure of a flexible display device according to an embodiment of the present disclosure.
Figure 2:
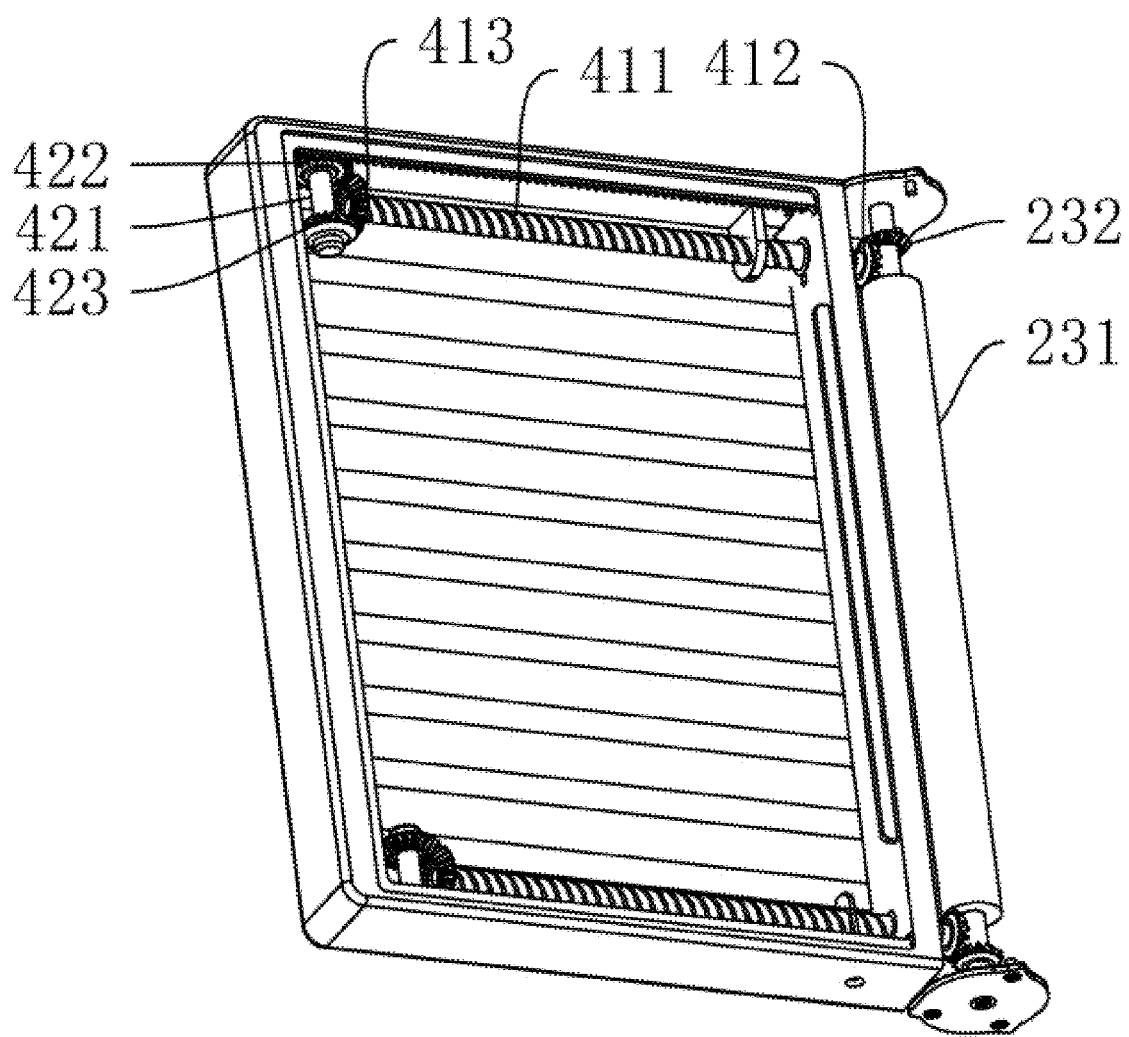
FIG. 2 is a bottom view of the flexible display device in a first state according to an embodiment of the present disclosure.
Figure 3:
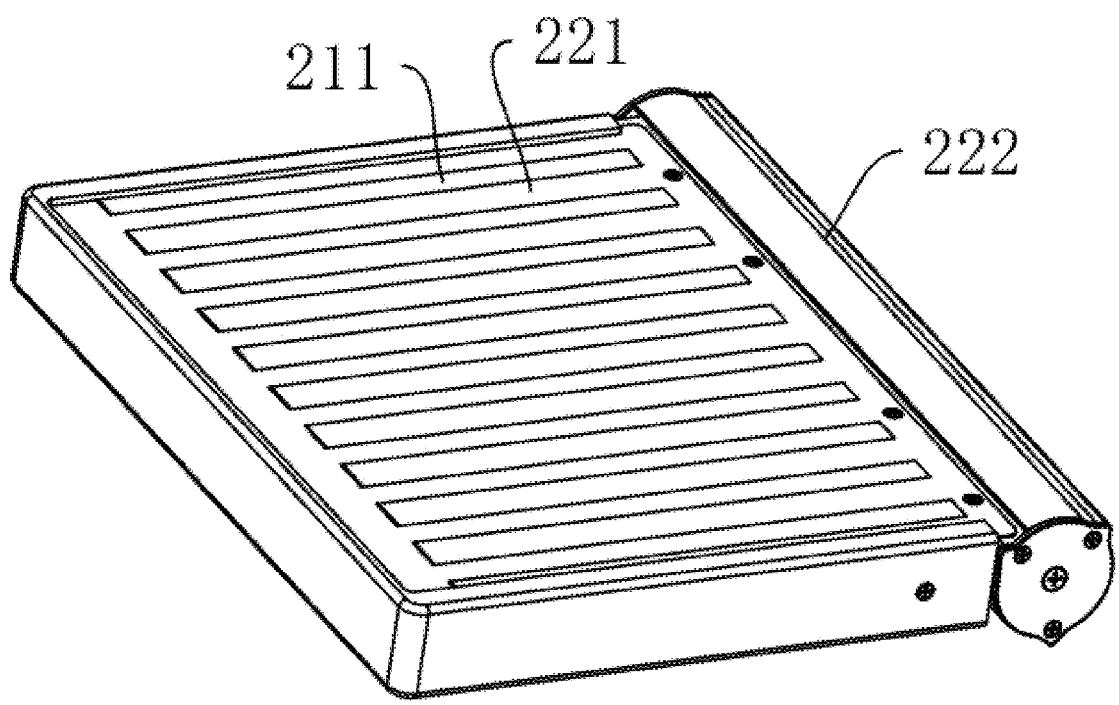
FIG. 3 is a top view of the flexible display device in the first state according to an embodiment of the present disclosure.
Figure 4:
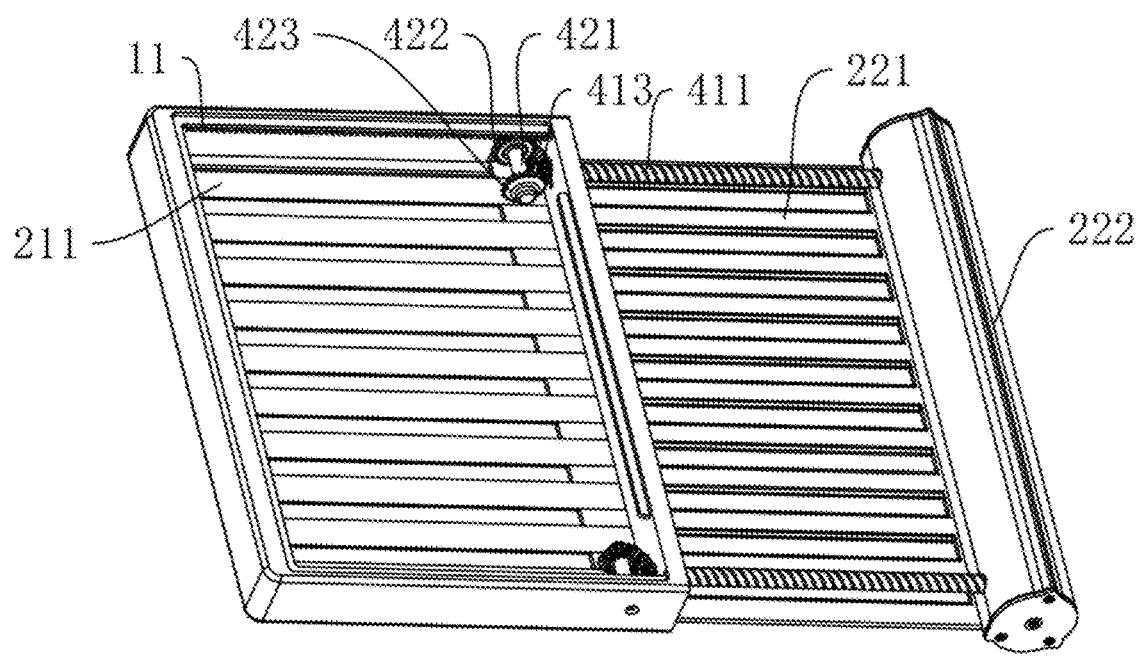
FIG. 4 is a bottom view of the flexible display device in a second state according to an embodiment of the present disclosure.
Figure 5:
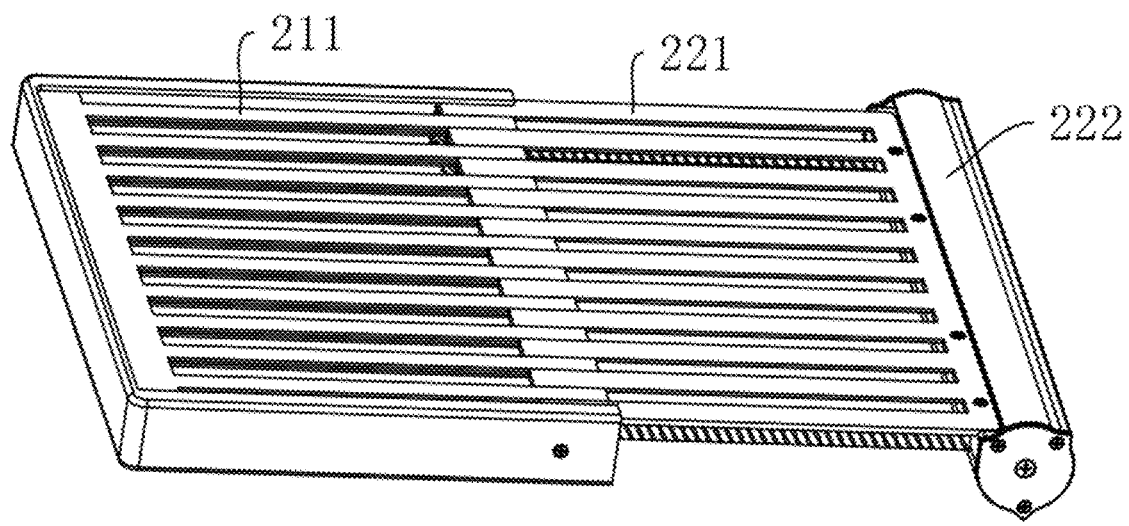
FIG. 5 is a top view of the flexible display device in the second state according to an embodiment of the present disclosure.

An embodiment of the present disclosure provides a flexible display device. Refer to FIG. 1. The flexible display device includes a housing 10, a telescopic assembly 20, a flexible screen 30, and a transmission assembly 40.

The telescopic assembly 20 includes a first support portion 21 disposed on the housing 10, a second support portion 22 movably connected to the first support portion 21, and a rotary receiving portion 23 disposed in the second support portion 22.

The flexible screen 30 is disposed on the telescopic assembly 20. One end of the flexible screen 30 is connected to the first support portion 21, and an other end of the flexible screen 30 is connected to the rotary receiving portion 23.

The transmission assembly 40 is disposed on the second support portion 22. One end of the transmission assembly 40 is movably connected to the housing 10, and an other end of the transmission assembly 40 is drivingly connected to the rotary receiving portion 23. Further, the transmission assembly 40 is configured to, during the movement relative to the housing 10, drive the second support portion 22 to move relative to the first support portion 21, and drive the rotary receiving portion 23 to rotate, so as to switch the flexible display device between a first state and a second state. An area of the flexible screen 30 in the first state on the first support portion 21 and the second support portion 22 is less than an area of the flexible screen 30 in the second state on the first support portion 21 and the second support portion 22.

During the implementation and application process, according to the embodiment of the present disclosure, two ends of the flexible screen 30 are respectively connected to the first support portion 21 and the rotary receiving portion 23, and the first support portion 21 and the second support portion 22 are moved relative to each other. In this way, the area of the flexible screen 30 spread on the first support portion 21 and the second support portion 22 is increased or decreased, so as to realize the switching between the large-size display and the small-size display. In addition, according to the embodiment of the present disclosure, the transmission assembly 40 is disposed to be connected between the housing 10 and the rotary receiving portion 23. During the movement relative to the housing 10, the transmission assembly 40 not only can drive the first support portion 21 to move relative to the second support portion 22, but also can drive the rotary receiving portion 23 to rotate. In turn, the flexible screen 30 can be rotated and received on the rotary receiving portion 23, or rotated and stretched to the first support portion 21 and the second support portion 22 for display. According to the embodiment of the present disclosure, the transmission assembly 40 is disposed to achieve the synchronization of the relative movement of the first support portion 21 and the second support portion 22 and the rotation of the rotary receiving portion 23. Therefore, the force uniformity and synchronization of the flexible display device during the state switching process are improved. In this way, the flexible screen 30 can be prevented from being damaged due to uneven transmission force. Therefore, by means of the embodiments of the present disclosure, the reliability of the flexible display device is improved, and the rapid and flexible switching of the flexible display device between the small-size portable state and the large-size display state is implemented.

In detail, refer to FIGS. 1, 2, 3, 4, and 5. The flexible display device includes a housing 10, a telescopic assembly 20, a flexible screen 30, and a transmission assembly 40.

The housing 10 includes an outer frame 11 and a rear plate 12 disposed on a side of the outer frame that is away from a display surface of the flexible display device.

The telescopic assembly 20 includes a first support portion 21 movably connected to the housing 10, a second support portion 22 movably connected to the first support portion 21, and a rotary receiving portion 23 disposed in the second support portion 22. The first support portion 21 is slidable relative to the housing 10 in a first direction X, and a sliding distance is relatively small. An elastic member 112 is connected between the housing 10 and the first support portion 21, so that the first support portion 21 has a pre-tightening force during the sliding process in the first direction X relative to the housing 10.

Further, a side of the first support portion 21 that faces the display surface of the flexible display device includes a plurality of first support plates 211, and a side of the second support portion 22 that faces the display surface of the flexible display device includes a plurality of second support plates 221. The plurality of first support plates 211 and the plurality of second support plates 221 are movable relative to each other in the first direction X. The flexible screen 30 is laid on the plurality of first support plates 211 and the plurality of second support plates 221 for display.

The plurality of first support plates 211 and the plurality of second support plates 221 are disposed alternately. In addition, the plurality of first support plates 211 and the plurality of second support plates 221 are coplanarly disposed facing one side of the display surface of the flexible display device, and a distance between any two adjacent first support plates 211 is equal to a width of any second support plate 221, so as to provide flat support for the flexible screen 30.

The second support portion 22 further includes an end housing 222 disposed at an end of the second support portion 22 that is away from the first support portion 21. The rotary receiving portion 23 is disposed in the end housing 222, and two ends of the rotary receiving portion 23 are rotatably connected to two opposite sides of the end housing 222.

It should be noted that one end of the flexible screen 30 is fixedly connected to a side of the first support portion 21 that is away from the end housing 222, and an other end of the flexible screen 30 is fixedly connected to the rotary receiving portion 23, and can be rolled and received on the rotary receiving portion 23 with the rotation of the rotary receiving portion 23.

The telescopic assembly 20 includes at least one first transmission member 41 disposed on the second support portion 22 and movably connected to the housing and at least one second transmission member 42 disposed on the second support portion 22 and movably connected to the housing. One end of each first transmission member 41 is drivingly connected to one corresponding second transmission member, and an other end of the each first transmission member 41 is drivingly connected to the rotary receiving portion 23.

During the movement in the first direction X relative to the housing 10, the second transmission member 42 will drive, to rotate and move in the first direction X relative to the housing 10, the first transmission member 41 drivingly connected to the second transmission member. During the rotation, the first transmission member 41 will drive, to rotate the rotary receiving portion 23 drivingly connected to the first transmission member. In addition, during the movement of the first transmission member 41 and the second transmission member 42 in the first direction X relative to the housing 10, the second support portion 22 and the first support portion 21 are movable relative to each other.

It should be noted that when the first transmission member 41 and the second transmission member 42 move in a forward direction of the first direction X relative to the housing 10, the first support plate 211 and the second support plate 221 are far away from each other. One end of the flexible screen 30 is connected to the first support portion 21 and receives a reverse pulling force in the first direction X, and an other end of the flexible screen 30 is connected to the rotary receiving portion 23. The flexible screen 30 crimped on the rotary receiving portion 23 is rolled out by the rotary receiving portion, to be spread on the plurality of first support plates 211 and the plurality of second support plates 221, so as to realize a large-size display. When the first transmission member 41 and the second transmission member 42 move to a predetermined distance in the forward direction of the first direction X relative to the housing 10, the area of the flexible screen 30 spread on the plurality of first support plates 211 and the plurality of second support plates 221 reaches the maximum, which is in a second state, that is, a large-size display state.

When the first transmission member 41 and the second transmission member 42 move in a reverse direction of the first direction X relative to the housing 10, the first support plate 211 and the second support plate 221 are close to each other. One end of the flexible screen 30 is connected to the first support portion 21 and subjected to a forward pulling force in the first direction X, and an other end of the flexible screen 30 is connected to the rotary receiving portion 23. A part of the flexible screen 30 spread on the plurality of first support plates 211 and the plurality of second support plates 221 is crimped and received by the rotary receiving portion 23, so as to realize a small-size display. When the first transmission member 41 and the second transmission member 42 move to a predetermined distance in the reverse direction of the first direction X relative to the housing 10, the area of the flexible screen 30 spread on the plurality of first support plates 211 and the plurality of second support plates 221 reaches the minimum, which is in a first state, that is, a small-size display state.

It should be noted that when the flexible display device is in the first state and the second state, the elastic member 112 is in a stretched state, so that the pretightening force between the first support portion 21 and the housing 10 is maintained at all times. That is to say, the flexible screen 30 is always subjected to a pulling force in a direction opposite to the first direction X, so that the flexible screen 30 is in a tensioned state. In this way, no undulations occur when the flexible screen is spread on the plurality of first support plates 211 and the plurality of second support plates 221, thereby improving the display effect. In addition, the elastic member 112 in the second state has an elastic force greater than that of the elastic member 112 in the first state.

Preferably, the transmission assembly 40 includes two first transmission members 41 disposed on two opposite sides of the second support portion 22 and two second transmission members 42 disposed on the two opposite sides of the second support portion 22. One end of each first transmission member 41 is drivingly connected to one corresponding second transmission member 42, and an other end of the each first transmission member is drivingly connected to the rotary receiving portion 23. That is to say, according to the embodiment of the present disclosure, the first transmission member 41 and the second transmission member 42 are disposed on two opposite sides of the flexible display device, and also located on two opposite sides of the flexible screen 30. Then in the process of stretching and receiving the flexible screen 30, the tensile force on the flexible screen 30 is more uniform, thereby improving the yield rate of the flexible display device.

In the embodiment of the present disclosure, the first transmission member 41 includes a screw rod structure, and a first transmission gear 412 and a second transmission gear 413 respectively disposed at two ends of the screw rod structure. The screw rod structure includes a screw rod 411 and a sleeve member 414 sleeved on the screw rod 411. The first transmission gear 412 and the second transmission gear 413 are both a bevel gear.

Optionally, the screw rod structure provided in the embodiment of the present disclosure is a ball screw.

The second transmission member 42 includes a first rotary shaft 421 and a third transmission gear 422 and a fourth transmission gear 423 disposed at two ends of the first rotary shaft 421. The third transmission gear 422 is a spur gear, and the fourth transmission gear 423 is a bevel gear.

The rotary receiving portion 23 includes a second rotary shaft 231 and a fifth transmission gear 232 disposed at two ends of the second rotary shaft 231. The fifth transmission gear 232 is a bevel gear.

A rack 111 is disposed on the outer frame 11.

In the embodiment of the present disclosure, the first transmission member 41 and the second transmission member 42 are both disposed on two opposite sides of the second support portion 22. The connection and transmission structure on one side is used as an example for description in the embodiment of the present disclosure, and the connection and transmission structure on an other side is same as that on the side. Details will not be described herein again.

In detail, the first rotary shaft 421 is disposed on a side of the second support portion 22 that is close to the outer frame 11 and is rotatable relative to the second support portion 22. The third transmission gear 422 is connected to an end of the first rotary shaft 421 that is close to the outer frame 11, and the fourth transmission gear 423 is connected to an other end of the first rotary shaft 421. The third transmission gear 422 is meshed with the rack 111, the second transmission gear 413 is meshed with the fourth transmission gear 423, and the first transmission gear 412 is meshed with the fifth transmission gear 232. The outer frame 11 is also provided with an opening 113, and the sleeve member 414 is disposed at the opening 113. The screw rod 411 is a screw, and the sleeve member 414 includes a nut that matches the screw. Therefore, when the sleeve member 414 is disposed at the opening 113, due to the mechanism that the ball screw can convert the rotary motion into a linear and repeated motion, during the rotation of the screw rod 411 relative to the sleeve member 414, the screw rod 411 further reciprocates in the first direction X relative to the sleeve member 414. in addition, the sleeve member 414 is disposed on the outer frame 11. That is to say, the sleeve member is disposed on the housing 10. During the rotation of the screw rod 411, the screw rod further moves in the first direction X relative to the housing 10.

Carrying on with the foregoing, when the flexible display device is switched from the first state to the second state, the third transmission gear 422 rotates relative to the rack 111 in the forward direction of the first direction X, also drives the second support portion 22 to move in the forward direction of the first direction X, and drives the second support portion 22 to slide relative to the first support portion 21. In this way, the second support portion 22 and the first support portion 21 are moved away from each other, so that the support area of sides of the plurality of first support plates 211 and the plurality of second support plates 221 that face the display surface of the flexible display device increases. In addition, the fourth transmission gear 423 coaxially connected to the third transmission gear 422 also rotates. The fourth transmission gear 423 drives the second transmission gear 413 to rotate, and the second transmission gear 413 drives the screw rod 411 to rotate. During the rotation of the screw rod 411, the screw rod will move relative to the housing 10 in the forward direction of the first direction X. In addition, the screw rod 411 drives the first transmission gear 412 to rotate, the first transmission gear 412 drives the fifth transmission gear 232 to rotate, and the fifth transmission gear 232 drives the second rotary shaft 231 to rotate. In this way, a part of the flexible screen 30 rolled on the second rotary shaft 231 is pulled out to be spread on the plurality of first support plates 211 and the plurality of second support plates 221, so as to realize a large-size display.

When the flexible display device is switched from the second state to the first state, the third transmission gear 422 rotates relative to the rack 111 in the reverse direction of the first direction X, also drives the second support portion 22 to move in the reverse direction of the first direction X, and drives the second support portion 22 to slide relative to the first support portion 21. In this way, the second support portion 22 and the first support portion 21 are moved close to each other, so that the support area of sides of the plurality of first support plates 211 and the plurality of second support plates 221 that face the display surface of the flexible display device decreases. In addition, the fourth transmission gear 423 coaxially connected to the third transmission gear 422 also rotates. The fourth transmission gear 423 drives the second transmission gear 413 to rotate, and the second transmission gear 413 drives the screw rod 411 to rotate. During the rotation of the screw rod 411, the screw rod will move relative to the housing 10 in the reverse direction of the first direction X. In addition, the screw rod 411 drives the first transmission gear 412 to rotate, the first transmission gear 412 drives the fifth transmission gear 232 to rotate, and the fifth transmission gear 232 drives the second rotary shaft 231 to rotate. In this way, a part of the flexible screen 30 that is rolled on the second rotary shaft 231 is rolled and received, so that the flexible screen 30 partially spread on the plurality of first support plates 211 and the plurality of second support plates 221 is rolled and received, so as to achieve a small-size display.

It should be noted that in the process of switching the flexible display device from the second state to the first state, a rolling velocity of the flexible screen 30 increases as a quantity of turns of the flexible screen 30 rolled on the second rotary shaft 231 increases, and is greater than a velocity at which the second support portion 22 moves in the reverse direction of the first direction X. When the quantity of turns of the flexible screen 30 rolled on the second rotary shaft 231 is greater than 1, a diameter of the second rotary shaft 231 during rotation increases. Since an angular velocity at which the second rotary shaft 231 rotates and the velocity at which the second support portion 22 moves in the reverse direction of the first direction X are both unchanged, a linear velocity at which the flexible screen 30 rolls increases as the diameter increases. Furthermore, the velocity at which the flexible screen 30 is rolled will be greater than the speed at which the second support portion 22 moves in the reverse direction of the first direction X. In this way, a forward pulling force in the first direction X may be generated on the flexible screen 30. However, the reverse pulling force of the elastic member 112 on the flexible screen 30 in the first direction X is gradually reduced during the switching from the second state to the first state, so that a magnitude of a total pulling force in the forward and reverse directions of the first direction X that is subjected to the flexible screen 30 remain consistent. Furthermore, while the flexible screen 30 is kept in a tensioned state during the stretching and receiving process, the magnitude of the pulling force subjected to the flexible screen will not change significantly, thereby preventing the flexible screen 30 from being damaged.

In an embodiment of the present disclosure, the second support portion 22 can be moved in the first direction X relative to the housing 10 by means of electric driving. In detail, the flexible display device further includes a motor (not shown in the figure) disposed in the housing 10, and the motor is disposed on the second support portion 22. An output end of the motor is connected to the fourth transmission gear 423, drives the fourth transmission gear 423 to rotate, and also drives the third transmission gear 422 and the screw rod 411 to rotate, thereby achieving the switching process between the first state and the second state.

It should be noted that the motor may further be disposed in the end housing 222, and the output end of the motor is connected to the fifth transmission gear 232. In this way, the fifth transmission gear 232 rotates, and then drives the screw rod 411 to rotate, so as to achieve the switching process in a support between the first state and the second state.

In another embodiment of the present disclosure, the end housing 222 and the outer frame 11 can be simultaneously pulled in the forward and reverse directions of the first direction X, so that the third transmission gear 422 rotates on the rack 111, and then drives the screw rod 411 to rotate, so as to achieve the switching process between the first state and the second state.

Based on the above, in the flexible display device provided in the embodiment of the present disclosure, the transmission assembly 40 having the screw rod 411 mated with the gear set is disposed on the two opposite sides of the first support portion 21 and the second support portion 22. In this way, two sides of the flexible screen 30 are synchronously stretched and received and subjected to the uniform force, thereby preventing the flexible screen 30 from being damaged due to uneven force, and improving the yield of the flexible display device.

In the foregoing embodiments, description of each embodiment focuses on a different part, and for parts that are not described in detail in an embodiment, reference may be made to the relevant description of other embodiments.

A flexible display device provided in the embodiments of the present disclosure is described in detail above. The principles and implementations of this application are described by using specific examples in this specification, and the descriptions of the embodiments are only intended to help understand the technical solutions and core ideas of the present disclosure. A person of ordinary skill in the art should understand that modifications may still be made to the technical solutions described in the foregoing embodiments or equivalent replacements may be made to some technical features thereof, as long as such modifications or replacements do not make the essence of corresponding technical solutions depart from the scope of the technical solutions of the embodiments of the present disclosure.

What is claimed is:

1. A flexible display device, comprising:
   a housing;
   a telescopic assembly comprising a first support portion disposed on the housing, a second support portion movably connected to the first support portion, and a rotary receiving portion disposed in the second support portion;
   a flexible screen disposed on the telescopic assembly, and having one end connected to the first support portion and another end connected to the rotary receiving portion; and
   a transmission assembly disposed on the second support portion, wherein the transmission assembly comprises at least one first transmission member, and the at least one first transmission member comprises a screw rod structure comprising a screw rod and a sleeve member sleeved on the screw rod,
   wherein one end of the screw rod is movably connected to the housing and another end of the screw rod is drivingly connected to the rotary receiving portion, and when the screw rod moves relative to the housing, the second support portion is driven to move relative to the first support portion and the rotary receiving portion is driven to rotate, so that the flexible display device is switched between a first state and a second state, and wherein an area of the flexible screen on the first support portion and the second support portion in the first state is less than an area of the flexible screen on the first support portion and the second support portion in the second state.

2. The flexible display device as claimed in claim 1, wherein the sleeve member is fixed to the housing, and the screw rod is movable relative to the sleeve member in a first direction X while rotating.

3. The flexible display device as claimed in claim 1, wherein the transmission assembly comprises at least one second transmission member disposed on the second support portion and movably connected to the housing, and the screw rod is drivingly connected to one corresponding second transmission member.

4. The flexible display device as claimed in claim 3, wherein a rack is disposed on the housing, and the at least one second transmission member is meshed with the rack to move in the first direction X, so as to drive the screw rod to move in the first direction X and rotate.

5. The flexible display device as claimed in claim 4, wherein the at least one first transmission member comprises a first transmission gear and a second transmission gear respectively disposed at two ends of the screw rod, and the first transmission gear is drivingly connected to the rotary receiving portion; and
   the at least one second transmission member comprises a first rotary shaft, a third transmission gear disposed on one end of the first rotary shaft and meshed with the rack, and a fourth transmission gear disposed at another end of the first rotary shaft and meshed with the second transmission gear.

6. The flexible display device as claimed in claim 5, further comprising a motor disposed in the housing, wherein an output end of the motor is connected to the fourth transmission gear.

7. The flexible display device as claimed in claim 5, wherein the rotary receiving portion comprises a second rotary shaft and a fifth transmission gear disposed on the second rotary shaft, and the fifth transmission gear is meshed with the first transmission gear.

8. The flexible display device as claimed in claim 3, wherein the transmission assembly comprises two first transmission members disposed on two opposite sides of the second support portion and two second transmission members disposed on the two opposite sides of the second support portion.

9. The flexible display device as claimed in claim 1, further comprising an elastic member connected between the housing and the first support portion, wherein the first support portion is movably connected to the housing.

10. The flexible display device as claimed in claim 9, wherein the elastic member is in a stretched state in both the first state and the second state.

11. The flexible display device as claimed in claim 1, wherein the first support portion comprises a plurality of first support plates, the second support portion comprises a plurality of second support plates, and the flexible screen is laid on the plurality of first support plates and the plurality of second support plates, and wherein the plurality of first support plates are movably connected to the plurality of second support plates.

12. The flexible display device as claimed in claim 11, wherein the plurality of first support plates and the plurality of second support plates are alternately disposed, and a distance between any two adjacent first support plates is equal to a width of any one second support plate.

13. A flexible display device, comprising:
   a housing;
   a telescopic assembly comprising a first support portion disposed on the housing, a second support portion movably connected to the first support portion, and a rotary receiving portion disposed in the second support portion;
   a flexible screen disposed on the telescopic assembly, and having one end connected to the first support portion and another end connected to the rotary receiving portion; and
   a transmission assembly disposed on the second support portion, wherein the transmission assembly comprises at least one first transmission member, the at least one first transmission member comprises a screw rod structure comprising a screw rod and a sleeve member sleeved on the screw rod, wherein the sleeve member is fixed to the housing, and the screw rod is movable relative to the sleeve member in a first direction X while rotating, wherein one end of the screw rod is movably connected to the housing and another end of the screw rod is drivingly connected to the rotary receiving portion, and when the screw rod moves relative to the housing, the second support portion is driven to move relative to the first support portion and the rotary receiving portion is driven to rotate, so that the flexible display device is switched between a first state and a second state, and wherein an area of the flexible screen on the first support portion and the second support portion in the first state is less than an area of the flexible screen on the first support portion and the second support portion in the second state.

14. The flexible display device as claimed in claim 13, wherein the transmission assembly comprises at least one second transmission member disposed on the second support portion and movably connected to the housing, and the screw rod is drivingly connected to one corresponding second transmission member.

15. The flexible display device as claimed in claim 14, wherein a rack is disposed on the housing, and the at least one second transmission member is meshed with the rack to move in the first direction X, so as to drive the screw rod to move in the first direction X and rotate.

16. The flexible display device as claimed in claim 15, wherein the at least one first transmission member comprises a first transmission gear and a second transmission gear respectively disposed at two ends of the screw rod, and the first transmission gear is drivingly connected to the rotary receiving portion; and the at least one second transmission member comprises a first rotary shaft, a third transmission gear disposed on one end of the first rotary shaft and meshed with the rack, and a fourth transmission gear disposed at another end of the first rotary shaft and meshed with the second transmission gear.

17. The flexible display device as claimed in claim 16, further comprising a motor disposed in the housing, wherein an output end of the motor is connected to the fourth transmission gear.

18. The flexible display device as claimed in claim 16, wherein the rotary receiving portion comprises a second rotary shaft and a fifth transmission gear disposed on the second rotary shaft, and the fifth transmission gear is meshed with the first transmission gear.

19. The flexible display device as claimed in claim 13, further comprising an elastic member connected between the housing and the first support portion, wherein the first support portion is movably connected to the housing.

20. The flexible display device as claimed in claim 19, wherein the elastic member is in a stretched state in both the first state and the second state.

* * * * *